United States Patent
Dulle et al.

(10) Patent No.: US 10,295,584 B2
(45) Date of Patent: May 21, 2019

(54) SYSTEMS AND METHODS FOR MEASURING ISOLATION RESISTANCE

(71) Applicant: Johnson Controls Technology Company, Plymouth, MI (US)

(72) Inventors: Ronald J. Dulle, Mequon, WI (US); Mark R. Johnson, Milwaukee, WI (US)

(73) Assignee: Johnson Controls Technology Company, Auburn Hills, MI (US)

( * ) Notice: Subject to any disclaimer, the term of this patent is extended or adjusted under 35 U.S.C. 154(b) by 0 days.

(21) Appl. No.: 15/265,580

(22) Filed: Sep. 14, 2016

(65) Prior Publication Data

US 2018/0074108 A1    Mar. 15, 2018

(51) Int. Cl.

| | |
|---|---|
| *G01R 31/02* | (2006.01) |
| *B60L 11/18* | (2006.01) |
| *G01R 31/00* | (2006.01) |
| *G01R 31/36* | (2019.01) |
| *G01R 27/02* | (2006.01) |
| *H01M 10/48* | (2006.01) |

(52) U.S. Cl.
CPC ........ *G01R 31/025* (2013.01); *B60L 11/1851* (2013.01); *G01R 27/025* (2013.01); *G01R 31/007* (2013.01); *G01R 31/3696* (2013.01); *H01M 10/48* (2013.01)

(58) Field of Classification Search
None
See application file for complete search history.

(56) References Cited

U.S. PATENT DOCUMENTS

| | | | |
|---|---|---|---|
| 5,569,550 A | * | 10/1996 | Garrett .................. H01M 10/46 429/61 |
| 5,760,587 A | * | 6/1998 | Harvey ................ G01R 31/007 320/106 |
| 8,129,995 B2 | | 3/2012 | Kang |

(Continued)

FOREIGN PATENT DOCUMENTS

| | | |
|---|---|---|
| JP | 2005156302 | 6/2005 |
| KR | 20130091171 | 8/2013 |

OTHER PUBLICATIONS

PCT/US2017/042925 International Search Report and Written Opinion dated Oct. 25, 2017.

*Primary Examiner* — Melissa Koval
*Assistant Examiner* — Nasima Monsur
(74) *Attorney, Agent, or Firm* — Fletcher Yoder, P.C.

(57) ABSTRACT

An energy storage system may include battery packs, such that one terminal of the battery packs is electrically coupled to a resistor representative of an isolation resistance of the battery system. The system may include a semiconductor relay switch, a plurality of resistors configured to electrically couple to the battery packs via the semiconductor relay switch, a gain field-effect transistor (FET) configured to electrically short at least one resistor of the plurality of resistors, and a control system. The control system may send a first command to the semiconductor switch to close, acquire a first voltage waveform, send a second command to the semiconductor switch to open, send a third command to the gain FET to close, send a fourth command to the semiconductor switch to close, acquire a second voltage waveform, and determine the isolation resistance based on the first voltage waveform and the second voltage waveform.

20 Claims, 6 Drawing Sheets

(56) References Cited

U.S. PATENT DOCUMENTS

| | | | |
|---|---|---|---|
| 2008/0224687 A1 | 9/2008 | Breese et al. | |
| 2010/0246081 A1* | 9/2010 | Yano | B60L 3/0023 |
| | | | 361/91.5 |
| 2013/0257383 A1* | 10/2013 | Shim | H02J 3/32 |
| | | | 320/134 |
| 2013/0300430 A1 | 11/2013 | Lindsay et al. | |
| 2014/0021961 A1 | 1/2014 | Yamada et al. | |
| 2014/0159908 A1* | 6/2014 | Hong | G01R 31/025 |
| | | | 340/636.1 |
| 2015/0054337 A1 | 2/2015 | Ogale | |
| 2015/0276846 A1 | 10/2015 | Paris et al. | |

\* cited by examiner

SYSTEMS AND METHODS FOR MEASURING ISOLATION RESISTANCE

BACKGROUND

The present disclosure generally relates to the field of batteries and battery systems. More specifically, the present disclosure relates to isolation barrier fault detection for a battery system.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

Electrical systems often include a battery system to capture (e.g., store) generated electrical energy and/or to supply electrical power. For example, a stationary power system may include a battery system that receives electrical power output by an electrical generator and stores the electrical power as electrical energy. In this manner, the battery system may supply electrical power to electrical components using the stored electrical energy.

Additionally, a battery system may be included in the electrical system of an automotive vehicle to supply electrical power used to supplement the motive force (e.g., power) of the automotive vehicle. Such an automotive vehicle may be referred to as an xEV, where the term "xEV" is defined herein to include all of the following vehicles, or any variations or combinations thereof, that use electrical power to supplement vehicular motive force. For example, electric vehicles (EVs) may include a battery system that supplies electrical power to a battery-powered electric propulsion system (e.g., one or more motors), which provides all vehicular motive force. Additionally, hybrid electric vehicles (HEVs), also considered xEVs, may provide vehicular motive force using a combination of an internal combustion engine propulsion system and a battery-powered electric propulsion system, for example, supplied by a 48 volt or a 130 volt battery system.

In any case, electrical components in an electrical system may operate using differing voltage domains (e.g., ranges). For example, an electric motor may operate using high voltage (e.g., 48 volt) electrical power, whereas a control system may operate using low voltage (e.g., 12 volt) electrical power. To facilitate implementing multiple different voltage domains, one or more isolation barriers may be used between different voltage domains, for example, between electrical components and/or between electrical components and a common (e.g., system) ground. In some instances, faults in an isolation barrier may affect operation of the electrical system and/or the battery system. With this in mind, it is now recognized that improved systems and techniques for monitoring the isolation properties (e.g., resistance) of an isolation barrier may improve fault detection efficiency and, thus, operation of the electrical system and/or the battery system.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

To facilitate implementing multiple different voltage domains, in some embodiments, the battery system may include distinct sets of battery modules (e.g., packs) that output voltages in the different voltage domains. Additionally or alternatively, the electrical system may include a converter to convert electrical power between the different voltage domains. Furthermore, in some embodiments, the battery system may provide electrical power in a first voltage domain and an external power source (e.g., grid) may provide electrical power in a second voltage domain.

Moreover, one or more isolation barriers may be included in the battery system to reduce likelihood of electrical power deviating from target (e.g., desired) paths. For example, an undesired connection (e.g., short) between different voltage domains may affect voltage supplied to and, thus, operation of electrical components in the electrical system—particularly when the voltage deviates from target operating voltage of the electrical components. As such, an isolation barrier may be included between different voltage domains in the electrical system. For example, an isolation barrier may be implemented between electrical components operating in a first (e.g., high) voltage domain and electrical components operating in a second (e.g., low) voltage domain. Additionally or alternatively, an isolation barrier may be implemented between electrical components and a common ground (e.g., vehicle chassis and/or housing of the electrical system). In either case, one or more isolation barriers may be employed to reduce likelihood of faults affecting the operation of the battery system, operation of the electrical system, and/or the surrounding environment.

Accordingly, the present disclosure provides techniques to improve operation of a battery system and/or an electrical system by improving detection efficiency of faults occurring in one or more isolation barriers. In some embodiments, the battery system may include an isolation measurement circuit that regularly determines whether a fault is present in the one or more isolation barriers. In particular, the isolation measurement circuit may facilitate determining properties (e.g., isolation resistance) of an isolation barrier indicative of whether a fault in the isolation barrier is expected to be present. For example, the isolation measurement circuit may output measurements used to determine isolation resistance between electrical components separated by an isolation barrier and/or isolation resistance between electrical components and a common ground separated by an isolation barrier.

DRAWINGS

Various aspects of this disclosure may be better understood upon reading the following detailed description and upon reference to the drawings in which.

DETAILED DESCRIPTION

Figure 1:
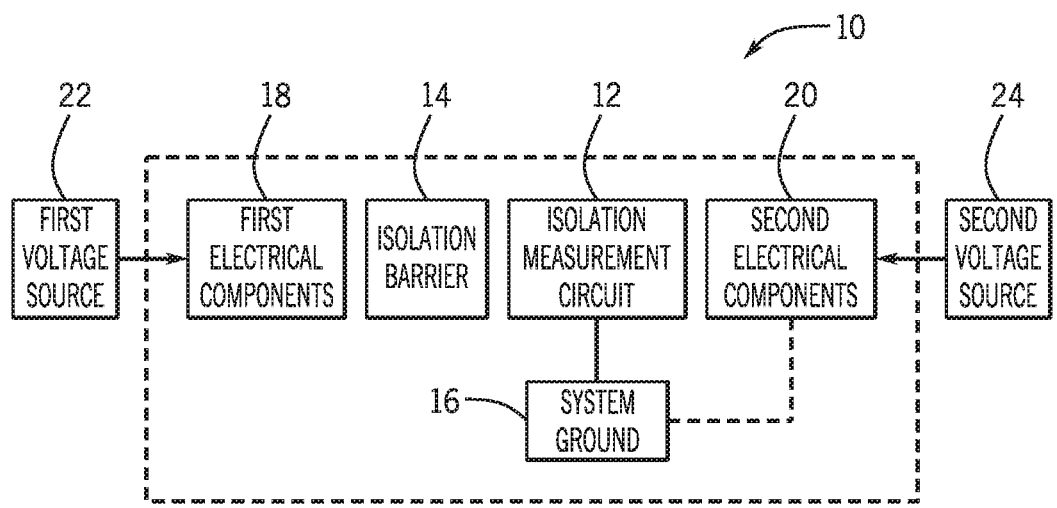
FIG. 1 is a block diagram of an electrical system, in accordance with an embodiment presented herein.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present disclosure relates to batteries and battery systems. More specifically, the present disclosure relates to determining isolation properties of an isolation barrier between different voltage domains in a battery system and/or an electrical system utilizing the battery system.

Generally, an electrical system may include a battery system to capture (e.g., store) generated electrical energy and/or to supply electrical power to electrical components (e.g., equipment, machines, and/or devices). For example, an automotive vehicle may include a battery system to supply electrical power to an electric motor, a battery control unit, a vehicle control unit, radio, and/or lights. In some embodiments, different electrical components may operate using electrical power in different voltage domains. For example, the electric motor may operate using operate using high voltage (e.g., 48 volt) electrical power, whereas the vehicle control unit may operate using low voltage (e.g., 12 volt) electrical power.

Accordingly, as mentioned above, the present disclosure provides techniques to improve operation of a battery system and/or an electrical system by improving detection efficiency of faults occurring in one or more isolation barriers. In some embodiments, the isolation measurement circuit may facilitate determining the isolation resistance without directly coupling the isolation measurement circuit or the one or more battery modules to the common ground. To facilitate determining the isolation resistance, the isolation measurement circuit may be coupled to a voltage source (e.g., one of the battery modules in the battery system). Additionally, in some embodiments, the isolation measurement circuit may also include a semiconductor relay switch (e.g., a PhotoMOS®), a number of gain field effect transistors (FETs), and/or a number of selectively connectable resistors.

In operation, the isolation measurement circuit may close the semiconductor relay switch and couple a first resistor circuit having a first known resistance to the battery module, for example, by maintaining a first gain FET open. When the semiconductor relay switch is closed, the isolation measurement circuit may capture (e.g., output) a first voltage waveform indicative of the isolation resistance of an isolation barrier between the voltage source and the common ground. For example, the first voltage waveform may indicate a first resistor-capacitor decay due to capacitance and resistance (e.g., the first known resistance and the isolation resistance) between the voltage source and the common ground. Based at least in part on the first voltage waveform and the first known resistance, in some embodiments, a control system (e.g., battery control unit) may determine the isolation resistance between the voltage source and the common ground.

However, in some instances, the capacitance between the voltage source and the common ground may vary (e.g., difficult to accurately determine), thereby affecting accuracy of the isolation resistance determined using only the first voltage waveform. To improve accuracy, in some embodiments, the isolation measurement circuit may close the semiconductor relay switch and couple a second resistor circuit having a second known resistance to the battery module, for example by closing the first gain FET. When the semiconductor relay switch is closed, the isolation measurement circuit may capture (e.g., output) a second voltage waveform that, for example, indicates a second resistor-capacitor decay due to the capacitance and resistance (e.g., the second known resistance and the isolation resistance) between the voltage source and the common ground.

Based at least on the two voltage waveforms and the two known resistances, the control system may determine the isolation resistance between the voltage source and the common ground. By utilizing the two voltage waveforms, the control system may determine the isolation resistance agnostic of the capacitance between the voltage source and the common ground. In this manner, the likelihood of variations in the capacitance affecting determination of the isolation resistance may be reduced.

Additionally, based at least in part on the isolation resistance, the control system may determine when a fault is expected to be present in the isolation barrier and control operation of the battery system and/or the electrical system accordingly. For example, the control system may determine that a fault is expected to be present when the isolation resistance is below a threshold resistance (e.g., minimum resistance expected to sufficient isolate two voltage domains). Additionally, in some embodiments, the control system may send a control command instructing a relay or circuit breaker to disconnect the voltage source when a fault in the isolation barrier is expected to be present. In this manner, likelihood of a fault in the isolation barrier affecting the battery system, the electrical system, and/or the surrounding environment may be reduced.

To help illustrate, a block diagram of an electrical system 10 is shown in FIG. 1. In the depicted embodiment, the electrical system 10 includes an isolation measurement circuit 12, an isolation barrier 14, a common ground 16, a one or more first electrical components 18, a second one or more electrical components 20, a first voltage source 22, and a second voltage source 24. In some embodiments, the first electrical components 18 and/or the second electrical components 20 may include any combination of equipment, machines, and devices that operate at least in part using electrical power. Additionally, in some embodiments, the first electrical components 18 may be designed (e.g., targeted) to operate using electrical power in a first voltage domain supplied by the first voltage source 22 and the second electrical components 20 may be designed to operate using electrical power in a second voltage domain supplied by the second voltage source 24.

In some embodiments, the target operating voltage of the first electrical components 18 and the second electrical components 20 may be different. For example, the target operating voltage of the first electrical components 18 may be in a 48 volt domain (e.g., range of voltages around 48 volts). On the other hand, the target operating voltage of the second electrical components 20 may be in a 12 volt domain (e.g., range of voltages around 12 volts). In other words, the first electrical components 18 may operate in a high voltage domain and the second electrical components 20 may operate in a low voltage domain, or vice versa.

As described above, the isolation barrier 14 may be implemented to electrically isolate different voltage domains. Thus, in the depicted embodiment, the isolation barrier 14 may be implemented to electrically isolate the first electrical components 18 from the second electrical components 20. Furthermore, since voltage domain (e.g., zero volts) of the common ground 16 may vary from the target operating voltage of the first electrical components 18 and/or the target operating voltage of the second electrical components 20, the isolation barrier 14 may additionally or alternatively electrical isolate the common ground 16 from the first electrical components 18 and/or the second electrical components 20.

To reduce likelihood of a fault in the isolation barrier affecting operation of the electrical system 10 and/or the surrounding environment, the isolation measurement circuit 12 may facilitate determining properties (e.g., isolation resistance) indicative of a fault in the isolation barrier 14. For example, the isolation measurement circuit 12 may facilitate determining isolation resistance between the first electrical component 18 and the second electrical component 20. Additionally or alternatively, the isolation measurement circuit 12 may facilitate determining isolation resistance between the common ground 16 and the first electrical components 18 and/or isolation resistance between the common ground 16 and the second electrical components 20.

Furthermore, in some embodiments, the isolation measurement circuit 12 may facilitate determining voltage and current measurements in the electrical system 10. For example, the isolation measurement circuit 12 may facilitate determining voltage of the first voltage source 22, voltage of the second voltage source 24, current supplied to the first electrical component 18, and/or current supplied to the second electrical components 20. In other words, the isolation measurement circuit 12 may be implemented to facilitate determining other operational parameters of the electrical system 10 in addition to isolation resistance—particularly when the isolation measurement circuit 12 is electrically coupled to a high voltage domain.

Figure 2:
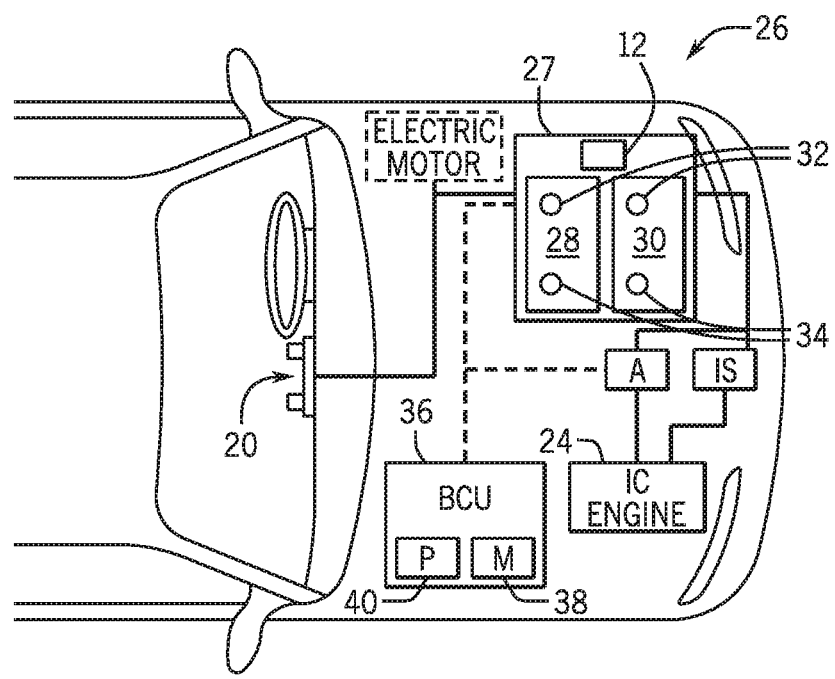
FIG. 2 is a cutaway schematic view of a vehicle including the electrical system of FIG. 1 implemented using a battery system, in accordance with an embodiment presented herein.

By way of a non-limiting example, the electrical system 10 may be implemented in an automotive vehicle using battery system 26 as shown in FIG. 2. As depicted, the battery system 26 includes an energy storage component 27 electrically coupled to various electrical components in the automotive vehicle, such as an ignition system, an alternator, a vehicle console, an electric motor, and the like. As described above, in some embodiments, different electrical components in the electrical system 10 may operate using electrical power in different voltage domains. For example, an electric motor may operate using electrical power in a 48 volt domain and a battery control unit 36 (e.g., control system) may operate using electrical power in a 12 volt domain.

Thus, in some embodiments, the battery system 26 may include multiple battery modules (e.g., packs) arranged to supply electrical power in different voltage domains. For example, in the depicted embodiments, the energy storage component 27 includes a first battery module 28 (e.g., first voltage source 22) that supplies electrical power in a first voltage domain and a second battery module 30 (e.g., second voltage source 30) that supply electrical power in a second voltage domain. Although depicted adjacent to one another, in some embodiments, the first battery module 28 and the second battery module 30 may be positioned in areas of the vehicle. Furthermore, in other embodiments, the energy storage component 27 may include any number of battery modules.

To facilitate receiving and/or supplying electrical power, each battery module may include a first terminal 32 and a second terminal 34. In some embodiments, the first terminal 32 may provide a positive voltage connection and the second terminal 34 may provide a battery system ground connection, which may be separated from the common ground 16 by one or more capacitors. As such, voltage at the battery system ground and the common ground 16 may be different.

Figure 3:
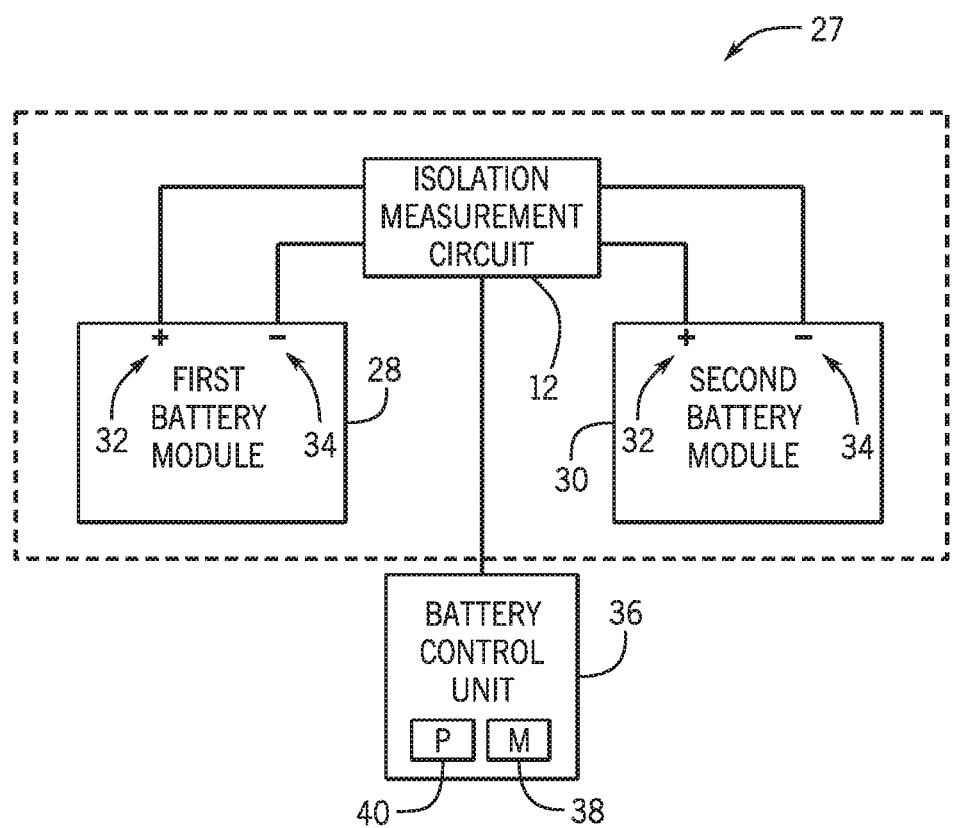
FIG. 3 is a block diagram of the battery system of FIG. 2 including an isolation measurement circuit, in accordance with an embodiment presented herein.

A more detailed view of an embodiment of the energy storage component 27 is shown in FIG. 3. As depicted, the energy storage component 27 includes the first battery module 28, the second battery module 30, the battery control unit 36, and the isolation measurement circuit 12. In some embodiments, the battery control unit 36 may generally control operation of the battery system 26, for example, by monitoring operational parameters related to the first battery module 28 and the second battery module 30. Moreover, the battery control unit 36 may control operation of the isolation measurement circuit 12, one or more relays electrically connected to the energy storage component 27, and the like.

To facilitate controlling various operations, the battery control unit 36 may include memory 38 and a processor 40. In some embodiments, the processor 40 may execute instructions stored in the memory 38. Thus, in some embodiments, the processor 40 may include may include one or more general-purpose microprocessors, one or more application specific processors (ASICs), one or more field programmable logic arrays (FPGAs), or any combination thereof. Additionally, in some embodiments, the memory 38 may include one or more tangible, non-transitory, computer-readable mediums. For example, the memory 38 may include random access memory (RAM), read only memory (ROM), rewritable non-volatile memory such as flash memory, hard drives, optical discs, and the like. Furthermore, in some embodiments, the battery control unit 36 may be included portions in a vehicle control unit (VCU) and/or as a separate control unit.

As described above, faults in the isolation barrier 14 may be detected based at least in part on isolation resistance across the isolation barrier 14. To facilitate detecting occurrence of a fault, the isolation measurement circuit 12 may facilitate determining isolation resistance between the first battery module 28 and the second battery module 30. Additionally or alternative, the isolation measurement circuit 12 may facilitate determining isolation resistance between the common ground 16 and the first battery module 28 or the second battery module 30. Thus, as depicted, the isolation measurement circuit 12 is electrically coupled to the first battery module 28 and the second battery module 30.

Figure 4:
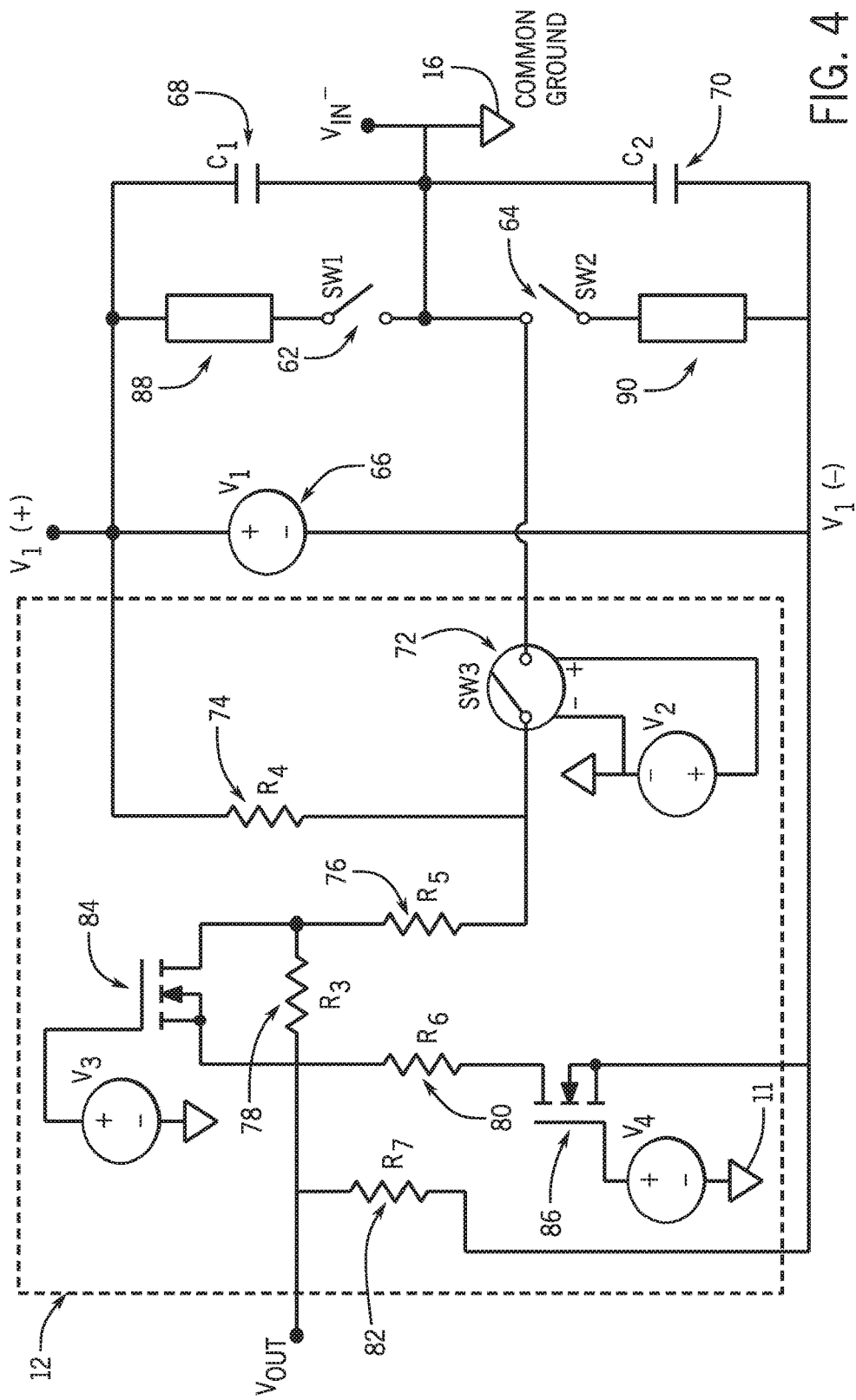
FIG. 4 is a schematic diagram of the isolation measurement circuit of FIG. 3, in accordance with an embodiment presented herein.

With the foregoing in mind, FIG. 4 illustrates an example implementation of the isolation measurement circuit 12. Although FIG. 4 illustrates a number of components as being part of the isolation measurement circuit 12, it should be understood that the depicted components are exemplary components, and the isolation measurement circuit 12 may employ a variety of different suitable components instead.

Referring to FIG. 4, the isolation measurement circuit 12 may be selectively coupled to a voltage source 66, which supplies electrical power in a specific voltage domain. Thus, in some embodiments, the voltage source 66 may include the first battery module 28 and/or the second battery module 30. Additionally, in certain embodiments, the voltage source 66 may correspond to the battery module that supplies electrical power in the higher voltage domain. As such, the components of the isolation measurement circuit 12 may already be exposed to the high voltage domain, thereby obviating additional hardware or protection components to isolate the components of the isolation measurement circuit 12 from the higher voltage domain. In this manner, the isolation measurement circuit 12 may be implemented to facilitate determining operational parameters including isolation resistance generally determined in the high voltage domain.

In the depicted embodiment, the isolation measurement circuit 12 may be selectively coupled to a voltage source 66 via a semiconductor relay switch 72 (e.g., PhotoMOS®). In some embodiments, the semiconductor relay switch 72 may use a light-emitting diode (LED) as an input and a metal-oxide-semiconductor field-effect transistor (MOSFET) as an output. Thus, by implementing the semiconductor relay switch 72, the voltage source 66 may be selectively connected to the isolation measurement circuit 12 while remaining electrically isolated from the common ground 16. In this manner, likelihood of the voltage source 66 affecting the environmental surrounding when determining isolation resistance may be reduced. Generally, PhotoMOS-type semiconductor relay switches are isolated from the circuit that they are switching between and have low leakage properties. Since isolation between circuits assist in the process in measuring the insulation resistance, the isolation features provided by the PhotoMOS-type semiconductor relay switches better enable the isolation measurement circuit 12 to measure the isolation resistance.

In particular, the semiconductor relay switch 72 may selectively connect one or more resistors with known resistances to the voltage source 66. For example, in the depicted embodiment, the semiconductor relay switch 72 may selectively connect some combination of a first resistor 74, a second resistor 76, a third resistor 78, a fourth resistor 80, and a fifth resistor 82 to the voltage source 66. In some embodiments, the resistors 74-82 may be sized in a variety of suitable resistances based on the properties of the battery system 26. It should be appreciated that although FIG. 4 depicts five distinct resistances, in other embodiments, the isolation measurement circuit 12 may include any number of resistors. For example, any of the resistors 74-82 may also be implemented as a single resistor, a series of individual resistors, parallel resistors, or a combination of series and parallel resistors. Additionally, multiple of the resistors 74-82 may be combined.

As depicted, the isolation measurement circuit 12 also includes a first gain field-effect transistor (FET) 84 and a second gain FET 86. In some embodiments, the first gain FET 84 and/or the second gain FET 86 may be opened and closed to adjust resistance connected to the voltage source 66 via the isolation measurement circuit 12. In particular, the first gain FET 84 may be opened and closed to control when the third resistor 78 is connected in the isolation measurement circuit 12. Additionally, the second gain FET 86 may be opened and closed to control when the fourth resistor 80 is connected in the is connected in the isolation measurement circuit 12. In one embodiment, the gain FET 84 may be a 200 volt amplifier device and the gain FET 86 is a lower voltage (e.g., 10-20V) amplifier device. In addition, the gain FET 84 and the gain FET 86 may each include two or three switches that may be controlled via control commands (e.g., gate signals) received from a control system (e.g., the battery control unit 36). In one embodiment, the battery control unit 36 may control the operation of each switch and each gain FET of the isolation measurement circuit 12, but it should be noted that any suitable processor or processing device may do the same.

In operation, the battery control unit 36 may determine an isolation resistance 88 between a positive bus (e.g., positive terminal of the voltage source 66) and the common ground 16. Additionally or alternatively, the battery control unit 36 may determine an isolation resistance 90 between a negative bus (e.g., battery system ground) and the common ground 16. That is, the battery control unit 36 may first close the semiconductor relay switch 72 and acquire a first RC decay waveform. The battery control unit 36 may then open the semiconductor relay switch 72 and close the gain FET 84, thereby effectively removing the resistor 78 from the isolation measurement circuit 12. The battery control unit 36 may then close the semiconductor relay switch 72 again and acquire a second RC decay waveform. Using the two acquired RC decay waveforms and the known resistances of the isolation measurement circuit 12, the battery control unit 36 may determine the isolation resistance 88 and/or the isolation resistance 90, for example, depending whether the first switch 62 or the second switch 64 is closed. It should be noted that the resistances 88 and 90 and switches 62 and 64 are not part of the isolation measurement circuit 12. Instead, these components are provided to for simulation of the circuit design and are not part of the embodiment that is used to measure the isolation resistance, as discussed above.

Figure 5:
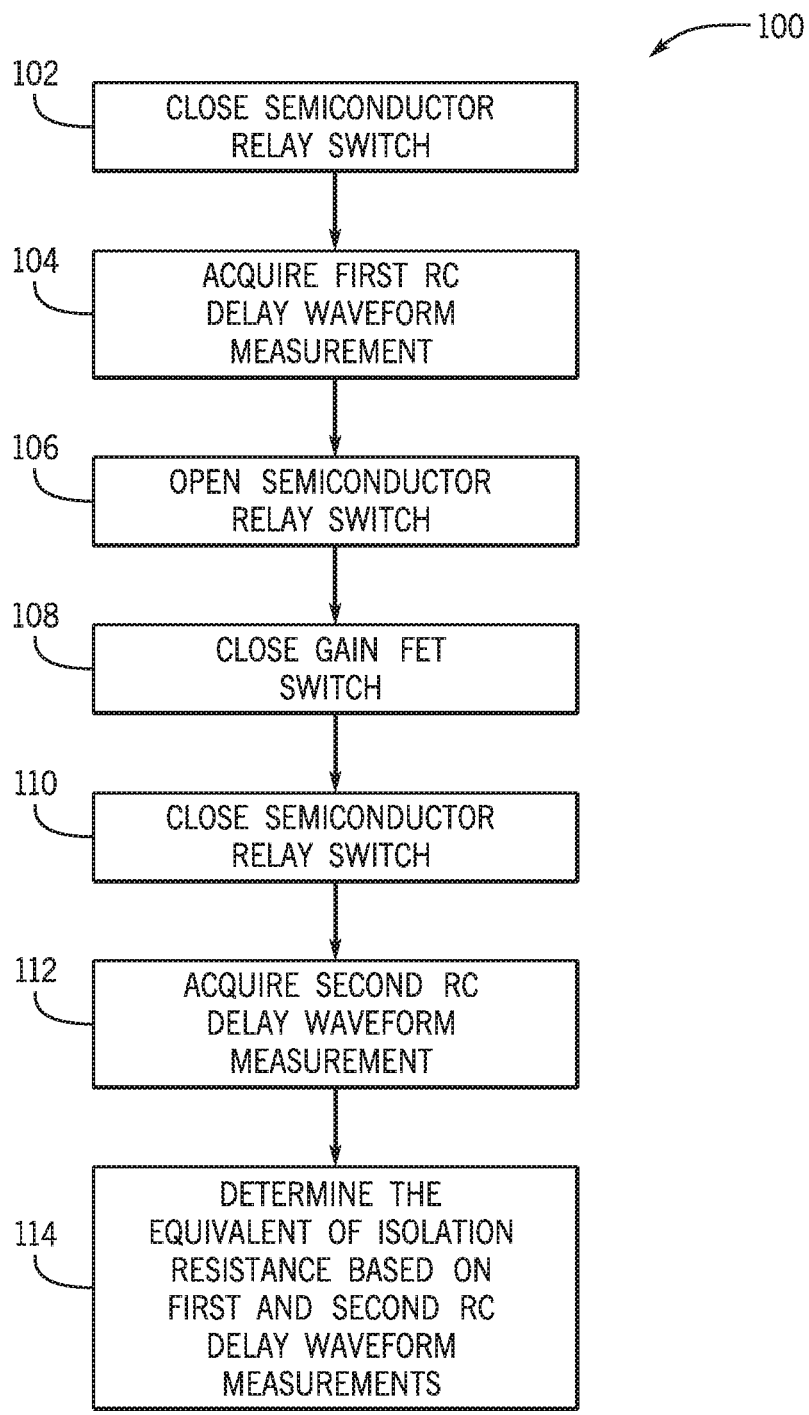
FIG. 5 is a flow chart of a process for operating the isolation measurement circuit of FIG. 3, in accordance with an embodiment presented herein.

With the foregoing in mind, FIG. 5 describes a process 100 for operating the isolation measurement circuit 12 to facilitate determining the isolation resistance 88 and/or the isolation resistance 90. In one embodiment, the process 100 may be performed by the battery control unit 36 (e.g., via the processor 40), but it should be noted that any suitable processor may perform the process 100. Although the process 100 is described as being performed in a particular order, it should be understood that the process 100 may be performed in any suitable order.

Referring now to FIG. 5, at block 102, the battery control unit 36 may send a control command (e.g., gate signal) instructing the semiconductor relay switch 72 to close. In some embodiments, prior to sending this control command, the battery control unit 36 may confirm that the first gain FET 84 is open. After the semiconductor relay switch 72 closes, at block 104, the battery control unit 36 may acquire a first voltage waveform via the output voltage node ($V_{out}$) of the isolation measurement circuit 12. In some embodiments, the first voltage waveform may correspond to a first RC decay, which may be represented by Equation 1 below.

$$Vout = V1\left(1 - e^{-\frac{t}{RC}}\right)$$ Equation 1 where $V_{out}$ corresponds to the output voltage node of the isolation measurement circuit 12, V1 corresponds to the voltage source 66, R corresponds to the equivalent resistance between the voltage source 66 and the common ground 16, and C corresponds to the capacitance (e.g., of capacitor 68 and/or capacitor 70) between the voltage source 66 and the common ground 16. In some embodiments, the $V_{out}$ node may be coupled to an analog-to-digital converter (ADC) that may be used to determine the first voltage waveform for processing by the battery control unit 36.

Figure 6:
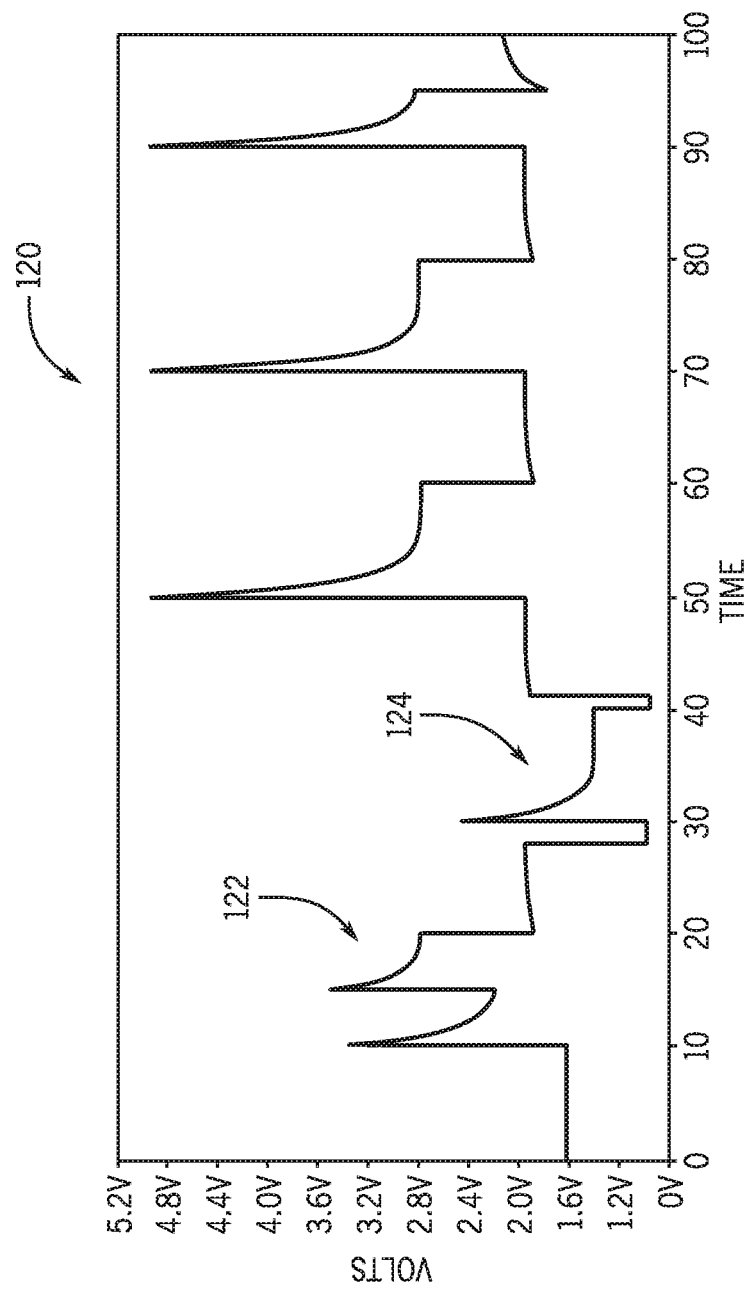
FIG. 6 is a plot of example waveforms determined by the isolation measurement circuit of FIG. 3, in accordance with an embodiment presented herein.

For illustration purposes, an example the first voltage waveform that may be determined is in graph 120 of FIG. 6. Referring briefly to FIG. 6, the first RC decay waveform measurement is represented by curve 122.

Based at least in part on the first voltage waveform, the battery control unit 36 may obtain four voltage samples at four distinct times during the decay portion of the curve, such that adjacent times of the four times have an equal amount of time between each other. The four voltage samples may then be used to determine the derivative of Equation 1, as shown in Equation 2 below.

$$\frac{dv}{dt} = \frac{1}{RC} * e^{-\frac{t}{RC}} \qquad \text{Equation 2}$$

Equation 2 operates on a premise of that the time derivative values (e.g., dt) are equal in a given sample window. It should be noted that the time derivative values may correspond to the first time constant area of the curve 122 and are approximately between 30-70 ms. Additional details with regard to how the time derivative values are used to determine the isolation resistance of the isolation measurement circuit 12 will be discussed below with reference to FIG. 7. In some embodiments, to facilitate achieving the target sampling rate, determination of the samples may be implemented via hardware circuitry.

Referring back to FIG. 5, at block 106, the battery control unit 36 may send a control command to the semiconductor relay switch 72 to open after the first voltage waveform is determined. The battery control unit 36 may then, at block 108, send a control command instructing the first gain FET 84 to close. After the first gain FET 84 closes, at block 110, the battery control unit 36 may send another control command instructing the semiconductor relay switch 72 to close while the gain FET switch 84 is closed.

At block 112, the battery control unit 36 may acquire a second voltage waveform when the first gain FET switch 84 is closed and resistor 78 is effectively disconnected from the isolation measurement circuit 12 and, thus, the voltage source 66. Based at least in part on the second voltage waveform, the battery control unit 36 may again obtain four voltage samples at four distinct times during the decay portion of the curve, such that adjacent times of the four times have an equal amount of time between each other. An example second voltage waveform is depicted with curve 124 of FIG. 6. As shown in FIG. 6, the slope of the curve 124 is different from the slope of the curve 122. The difference between these two curves is attributed to the difference between the resistance of the isolation measurement circuit 12 connects to the voltage source 66.

After acquiring the second voltage waveform, at block 114, the battery control unit 36 may determine a Thevenin equivalent resistance of the isolation resistance 88 and/or the isolation resistance 90 based at least in part on the first voltage waveform and the second voltage waveform. In some embodiments, the battery control unit 36 may regularly monitor the isolation resistance 88 and compare the isolation resistance to a threshold resistance. If the isolation resistance 88 is below the threshold, the battery control unit 36 may send a control command instructing to a relay or circuit breaker to disconnect the voltage source 66 from the battery system 26 and/or the electrical system 10. As such, the battery control unit 36 may effectively remove a power source when a fault in the isolation barrier 14 is expected to have occurred, thereby reducing likelihood of the fault affecting the battery system 26, the electrical system 12, and/or the surrounding environment.

By utilizing the first voltage waveform and the second voltage waveform, the battery control unit 36 may determine the isolation resistance with the assumption that the capacitance between the voltage source 66 and the common control 16 is relatively constant when determined. In this manner, the battery control unit 36 may reduce likelihood of uncertainty in the capacitance of the capacitors 68 and/or 70 on determination of the isolation resistance, thereby improving accuracy of the isolation resistance determination. However, in some instances, the capacitance between the voltage source 66 and the common ground 16 may be determined with relative accuracy, for example, upon startup while the voltage source 66. In such instances, the battery control unit 36 may use a known capacitance to determine the isolation resistance using only one voltage waveform.

Figure 7:
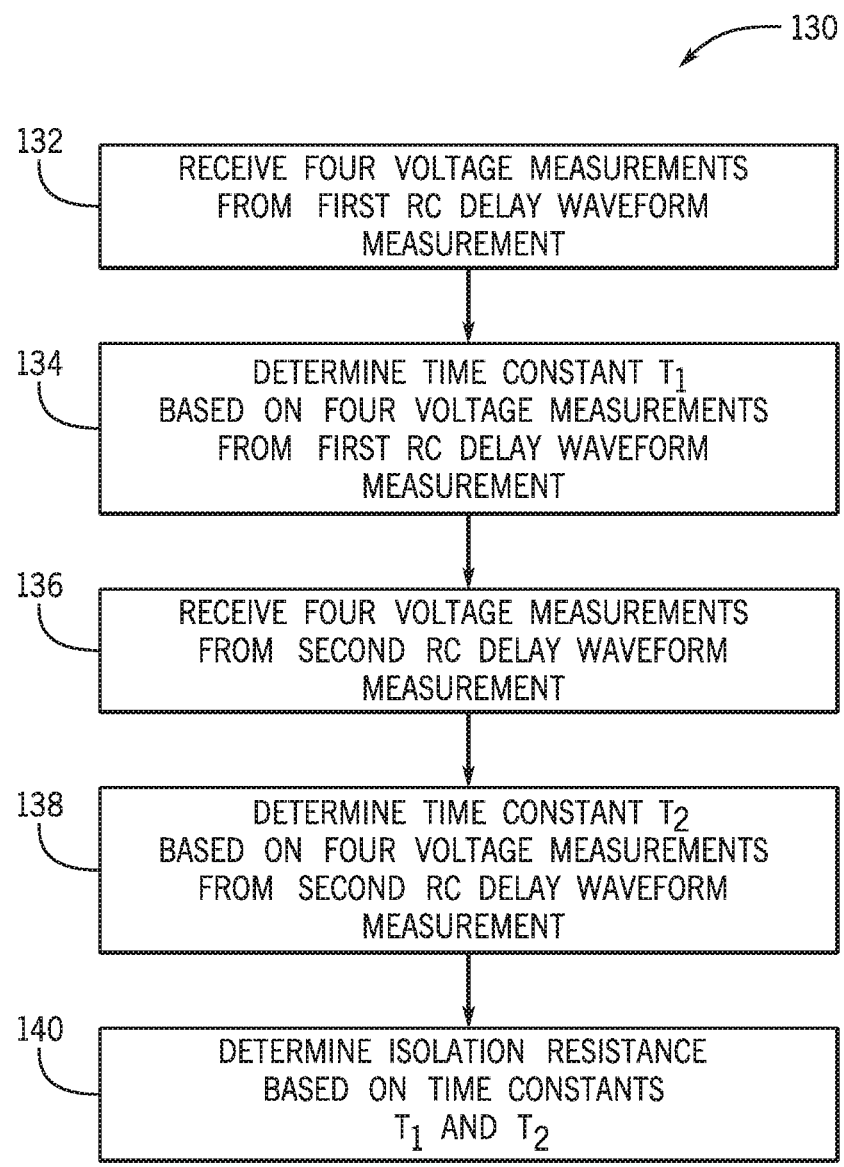
FIG. 7 is a flow chart of a process for determining isolation properties of an isolation barrier using the isolation measurement circuit of FIG. 4, in accordance with an embodiment presented herein.

FIG. 7 describes a process 130 for determining the isolation resistance based at least in part on the determined one or more voltage waveforms. As discussed above with reference to the process 100 of FIG. 6, the following description of the process 130 is described as being performed by the battery control unit 36 but it should be understood that any suitable processor may perform the process 130. Moreover, although the following description of the process 130 is described in a particular order, it should be noted that the method 130 may be performed in any suitable order.

Referring now to FIG. 7, at block 132, the battery control unit 36 may receive at least four voltage measurements from the a RC decay waveform measurement, for example, determined at block 104 of the process 100. In some embodiments, the voltage measurements may be acquired during the decay portion of the first RC decay waveform. As discussed above, the first RC decay waveform measurement is acquired when the first gain FET 84 is open. The four voltage values may be denoted as voltage V1 at time t1, voltage V2 at time t2, voltage V3 at time t2, and voltage V4 at time t4 with respect to the first RC decay waveform measurement (e.g., curve 122).

Using these voltage measurements, at block 134, the battery control unit 36 may determine a first time constant $\tau_1$ based on the four voltage measurements. For instance, based on the four voltage measurements, the battery control unit 36 may obtain two differential voltages (DV):

$$DV1 = V2 - V1 \text{ and} \qquad (1)$$

$$DV2 = V4 - V3. \qquad (2)$$

As mentioned above, the time difference between each adjacent voltage measurement may be substantially equal. As such, the difference between time t2 and time t1 should be equal to the difference between time t4 and time t3, as provided below in Equation 3.

$$t2 - t1 = t4 - t3 \qquad \text{Equation 3}$$

Based on the time relationship described in Equation 3, the battery control unit 36 may obtain two voltage differential values (e.g., dv/dt). Accordingly, based on the time relationship of Equation 3 and the acquired voltage waveform measurement characteristic curve of Equation 1, the two voltage differential values may be described according to Equations 4 and 5 below.

$$\frac{dv1}{dt1} = \frac{1}{R1C} * e^{-\frac{t2}{R1C}} \quad \text{Equation 4}$$

$$\frac{dv2}{dt2} = \frac{1}{R1C} * e^{-\frac{t4}{R1C}} \quad \text{Equation 5}$$

where R1 is a determined isolation resistance based on the first acquired RC decay waveform measurement.

By rearranging Equations 4 and 5 to solve for the time differential dt, the battery control unit 36 may set Equation 4 equal to Equation 5 since dt1=dt2. As a result, the battery control unit 36 may obtain Equation 6 that represents the first time constant $\tau_1$.

$$\tau_1 = \frac{t4 - t2}{\ln\left(\frac{dv1}{dv2}\right)} \quad \text{Equation 6}$$

Referring back to the process 130 of FIG. 6, at block 136, the battery control unit 36 may receive four voltage measurements (e.g., voltage V5 at time t5, voltage V6 at time t6, voltage V7 at time t7, and voltage V8 at time t8) from the second RC decay waveform measurement, for example, determined at block 112 of the process 100. Like the first four voltage measurements received at block 132, the time difference between each adjacent voltage measurement may be substantially equal, as provided below in Equation 7.

$$t6-t5=t8-t7 \quad \text{Equation 7}$$

Moreover, it should be noted that the differences between each adjacent time values of the voltage measurements from the first set of voltage measurements (e.g., V1-V4) are equal to the differences between each adjacent time values of the voltage measurements from the second set of voltage measurements (e.g., V5-V8).

At block 138, the battery control unit 36 may determine a second time constant $\tau_2$ based on the four voltage measurements associated with the second set of voltage measurements using the same process described above with respect to block 134. As such, the battery control unit 36 may determine the second time constant $\tau_2$ according to Equation 8.

$$\tau_2 = \frac{t8 - t6}{\ln\left(\frac{dv3}{dv4}\right)} \quad \text{Equation 8}$$

At block 140, the battery control unit 36 may determine the isolation resistance (e.g., resistance 88 and/or resistance 90) based on the first and second time constants $\tau_1$ and $\tau_2$. Since $\tau_1$=R1C and $\tau_2$=R2C, the time difference between each adjacent voltage measurement may be substantially equal, the battery control unit 36 may rearrange Equations 4 and 5 and similar equations determined based on the second set of voltages to isolate C, thereby obtaining Equation 9.

$$\frac{\tau_1}{R1} = \frac{\tau_2}{R2} \quad \text{Equation 9}$$

The battery control unit 36 may isolate the capacitance C even if the value is known in the system because capacitor tolerances vary (e.g., 10%). Resistances R1 and R2 represent a Thevenin equivalent of the isolation resistance and the measurement circuit resistance, respectively. R1 and R2 correspond to the thevenin equivalents that the Cy capacitors in the system are coupled to. By applying 2 different known resistances (e.g., Rcirc1 and Rcirc2) along with the unknown resistance (e.g., Riso), which would be the same in both instances, the two equations for R1 and R2, as provided below, will be realized. The equations for R1 and R2 are substituted into Equation 9 to represent resistances R1 and R2 as:

$$R1 = \frac{1}{\frac{1}{Riso} + \frac{1}{Rcirc1}} \quad \text{Equation 10}$$

$$R2 = \frac{1}{\frac{1}{Riso} + \frac{1}{Rcirc2}} \quad \text{Equation 11}$$

where $R_{iso}$ corresponds to the isolation resistance 88 and/or resistance 90, where $R_{circ1}$ corresponds to the equivalent resistance of the isolation measurement circuit 12 when the first gain FET 84 is open, and where $R_{circ2}$ corresponds to the equivalent resistance of the isolation measurement circuit 12 when the first gain FET 84 is closed, as described above with regard to the method 100 of FIG. 5. Riso is the unknown resistance that the isolation measurement circuit 12 is trying to determine. Rcirc1 and Rcirc2 are the known resistance that are applied to the system to determine Riso.

The battery control unit 36 may then synthesize Equations 10 and 11 to yield:

$$R_{final} = (Rsa + Rsca)*(Rsb + Rscb)* \quad \text{Equation 12}$$
$$\frac{tau2 - tau1}{tau1*(Rsb + Rscb) - tau2(Rsa + Rsca)}$$

where the Rsca and Rscb represent the different measurement circuit. Generally, Rsa and Rsca are components of Rcirc1; Rsb and Rscb are components of Rcirc2. Rfinal represents the Thevenin resistance looking out at the Cy capacitors in the system.

The battery control unit 36 may then determine the isolation resistance (e.g., resistance 88 and/or resistance 90) according to Equation 13.

$$R_{iso} = R_{final} * \frac{R_{pul}}{R_{pul} - R_{final}} \quad \text{Equation 13}$$

Rpul is a resistance pulled up to an intermediated value in the system. Rpul is provided in the case where the isolation fault is to ground. In this case, there would be no movement of the voltage input to the converter since the input is already at ground with the switches off and the application to ground. This would assure some movement of the ADC and an RC decay due to system capacitance such that the measurements may be obtained.

By employing the isolation measurement circuit 12 to determine the isolation resistance, the battery control unit 36 is capable of determining (e.g., measuring) the isolation resistance in a manner that is not sensitive to the Cy capacitance, analog-to-digital converter (ADC) accuracy, and/or an ADC reference. Additionally, the isolation measurement circuit 12 may be implemented using fewer semiconductor relay switches, is easier to calibrate, and eliminates the potentials for faults via the high voltage side of the battery system 12 by performing the isolation measurement on the high voltage side, as compared to previous systems and techniques for measuring isolation resistance that provides a voltage at a positive terminal of the battery system 12 and followed by a voltage at a negative terminal of the battery system 12.

Moreover, in other embodiments, the battery control unit 36 would wait until a waveform settled out due to the RC decay. Comparatively, implementing the above-described techniques enables the battery control unit 36 take advantage of the RC decay and make it part of the measurement. In this manner, the battery control unit 36 may detect faults faster and/or earlier, thereby reducing likelihood of a fault affecting the battery system 26, the electrical system 12, and/or the surrounding environment.

As such, the presently disclosed embodiments use less hardware and do not involve a dedicated ADC or precision references. Further, ADC accuracy does not affect the accuracy of the isolation resistance measurement. Calibration is not used to verify the isolation resistance measurement, and Cy capacitance does not alter the isolation resistance measurement. Moreover, by using the decay portion of the two RC decay waveforms, the presently disclosed embodiments may determine the isolation resistance measurement more quickly, as compared to waiting for each RC decay waveform to settle out to a relatively constant value before performing the isolation resistance calculations.

One or more of the disclosed embodiments, alone or in combination, may provide one or more technical effects including monitoring the isolation resistance of the battery system 26 and disconnecting a voltage source 66 (e.g., the first battery pack 28 and/or the second battery pack 30) from the battery system 26 and/or the electrical system 10. That is, when the isolation resistance is less than some threshold, a fault may be present on in one or more isolation barrier 14. Accordingly, presently disclosed systems and techniques assist in identifying when a potential fault is present in the battery system 26 and/or the electrical system 10 and isolates the source of the fault.

While only certain features and embodiments have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the disclosed subject matter. The order or sequence of any process or method steps may be varied or re-sequenced according to alternative embodiments. It is, therefore, to be understood that the appended claims are intended to cover all such modifications and changes as fall within the true spirit of the invention. Furthermore, in an effort to provide a concise description of the exemplary embodiments, all features of an actual implementation may not have been described. It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. An energy storage system configured to output at least two voltage waveforms, comprising:
   a semiconductor relay switch;
   one or more battery packs, wherein one terminal of the one or more battery packs of the energy storage system is electrically coupled to a resistor of a plurality of resistors, wherein the plurality of resistors is configured to electrically couple to the one or more battery packs via the semiconductor relay switch;
   a gain field-effect transistor (FET) configured to electrically short at least one resistor of the plurality of resistors, wherein the at least one resistor of the plurality of resistors is directly coupled to a voltage output terminal configured to output the at least two voltage waveforms for determining an isolation resistance of the energy storage system; and
   a control system configured to:
      send a first command to the semiconductor switch to close;
      acquire a first voltage waveform corresponding to a first voltage measurement over a first period of time at the voltage output terminal after the first command has been sent;
      send a second command to the semiconductor switch to open;
      send a third command to the gain FET to close after the second command has been sent, wherein the at least one resistor of the plurality of resistors is electrically shorted when the gain FET is closed;
      send a fourth command to the semiconductor switch to close after the third command has been sent;
      acquire a second voltage waveform corresponding to a second voltage measurement over a second period of time at the voltage output terminal after the fourth command has been sent; and
      determine the isolation resistance based at least in part on a Thevenin equivalent resistance calculated from the first voltage waveform and the second voltage waveform.

2. The energy storage system of claim 1, wherein the one or more battery packs comprise one or more lead acid battery packs or one or more lithium ion battery packs.

3. The energy storage system of claim 1, wherein the semiconductor relay switch comprises a light-emitting diode as an input and a metal-oxide-semiconductor field-effect transistor (MOSFET) as an output.

4. The energy storage system of claim 1, wherein the semiconductor relay switch comprises a PhotoMOS switch.

5. The energy storage system of claim 1, wherein the gain FET is configured to electrically couple to a system ground.

6. The energy storage system of claim 1, wherein the gain FET comprises a 200 volt rating.

7. The energy storage system of claim 1, comprising a first switch configured to electrically couple a first resistor to the one or more battery packs and a second switch configured to electrically couple a second resistor to the one or more battery packs.

8. The energy storage system of claim 1, comprising one or more capacitors electrically coupled to a system ground of a vehicle and the one or more battery packs.

9. A non-transitory computer-readable medium comprising computer-executable instructions configured to cause a processor to:

acquire a first voltage waveform corresponding to a first voltage measurement over a first period of time at a voltage output terminal configured to output at least two voltage waveforms when a plurality of resistors of a battery system is electrically coupled to one or more battery packs via a semiconductor relay switch;

acquire a second voltage waveform corresponding to a second voltage measurement over a second period of time at the voltage output terminal in response to at least one resistor of the plurality of resistors directly coupled to the voltage output terminal being electrically shorted via a gain field-effect transistor (FET);

determine an isolation resistance between a battery system and a chassis based at least in part on a Thevenin equivalent resistance calculated from the first voltage waveform and the second voltage waveform; and disconnect the one or more battery packs from the battery system in response to the isolation resistance being below a threshold resistance value.

10. The non-transitory computer-readable medium of claim 9, wherein the processor is configured to acquire the first voltage waveform when the gain FET is open.

11. The non-transitory computer-readable medium of claim 9, wherein the processor is configured to acquire the second voltage waveform when the gain FET is closed.

12. The non-transitory computer-readable medium of claim 9, wherein the first voltage waveform corresponds a resistor-capacitance (RC) decay waveform.

13. The non-transitory computer-readable medium of claim 9, wherein the first voltage measurements and the second voltage measurements each comprise at least four measurements.

14. The non-transitory computer-readable medium of claim 9, wherein each pair of adjacent voltage measurements of the first voltage measurements and the second voltage measurements comprise an equal amount of time between each other.

15. The non-transitory computer-readable medium of claim 9, wherein the Thevenin equivalent resistance is an equivalent resistance between the battery system and the chassis.

16. An isolation measurement circuit for measuring isolation resistance, comprising:

a semiconductor relay switch;

a plurality of resistors configured to electrically couple to one or more battery packs via the semiconductor relay switch, wherein one terminal of the one or more battery packs is electrically coupled to a resistor of the plurality of resistors of a battery system;

a gain field-effect transistor (FET) configured to electrically short at least one resistor of the plurality of resistors, wherein the at least one resistor of the plurality of resistors is directly coupled to a voltage output terminal configured to output a voltage waveform for determining an isolation resistance between the battery system and a chassis;

one or more capacitors electrically coupled to a system ground of a vehicle and the one or more battery packs; and a control system configured to:

acquire a first voltage waveform corresponding to a first voltage measurement over a first period of time at the voltage output terminal when the plurality of resistors is electrically coupled to the one or more battery packs via the semiconductor relay switch;

acquire a second voltage waveform corresponding to a second voltage measurement over a second period of time at the voltage output terminal in response to the at least one resistor of the plurality of resistors directly coupled to the voltage output terminal being electrically shorted via the gain field-effect transistor (FET); and determine the isolation resistance between the battery system and the chassis based at least in part on a Thevenin equivalent resistance calculated from the first voltage waveform and the second voltage waveform.

17. The isolation measurement circuit of claim 16, wherein the semiconductor relay switch comprises a light-emitting diode as an input and a metal-oxide-semiconductor field-effect transistor (MOSFET) as an output.

18. The isolation measurement circuit of claim 16, wherein the semiconductor relay switch comprises a PhotoMOS switch.

19. The isolation measurement circuit of claim 16, wherein the gain FET comprises a 200 voltage amplifier device.

20. The isolation measurement circuit of claim 16, wherein the first voltage waveform corresponds a resistor-capacitance (RC) decay waveform.

* * * * *

UNITED STATES PATENT AND TRADEMARK OFFICE
CERTIFICATE OF CORRECTION

PATENT NO. : 10,295,584 B2
APPLICATION NO. : 15/265580
DATED : May 21, 2019
INVENTOR(S) : Ronald J. Dulle et al.

It is certified that error appears in the above-identified patent and that said Letters Patent is hereby corrected as shown below:

In the Specification

1. In Column 2, Line 51, delete "DRAWINGS" and insert -- BRIEF DESCRIPTION OF DRAWINGS --, therefor.

2. In Column 6, Lines 7-8, delete "second voltage source 30)" and insert -- second voltage source 24 --, therefor.

3. In Column 6, Line 39, delete "may include may include" and insert -- may include --, therefor.

4. In Column 6, Lines 40-41, delete "application specific processors (ASICs)," and insert -- application specific integrated circuits (ASICs), --, therefor.

5. In Column 6, Lines 41-42, delete "field programmable logic arrays (FPGAs)," and insert -- field programmable gate arrays (FPGAs), --, therefor.

6. In Column 6, Line 58, delete "alternative," and insert -- alternatively, --, therefor.

7. In Column 8, Line 1, delete "is connected in the is connected in the" and insert -- is connected in the --, therefor.

8. In Column 10, Line 37, delete "the a" and insert -- "the" --, therefor.

Signed and Sealed this
Twenty-seventh Day of August, 2019

Andrei Iancu
*Director of the United States Patent and Trademark Office*